(12) United States Patent
Chen et al.

(10) Patent No.: US 8,906,715 B2
(45) Date of Patent: Dec. 9, 2014

(54) LIGHT EMITTING DIODE PACKAGE HAVING FLUORESCENT FILM DIRECTLY COATED ON LIGHT EMITTING DIODE DIE AND METHOD FOR MANUFACTURING THE SAME

(75) Inventors: Lung-Hsin Chen, Hsinchu (TW); Wen-Liang Tseng, Hsinchu (TW); Pin-Chuan Chen, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 28 days.

(21) Appl. No.: 13/600,236

(22) Filed: Aug. 31, 2012

(65) Prior Publication Data

US 2013/0161673 A1 Jun. 27, 2013

(30) Foreign Application Priority Data

Dec. 27, 2011 (CN) .......................... 2011 1 0444174

(51) Int. Cl.
*H01L 21/00* (2006.01)
(52) U.S. Cl.
USPC .............................................. 438/26; 438/126
(58) Field of Classification Search
USPC .................................... 438/106–127, 26–28
See application file for complete search history.

(56) References Cited

U.S. PATENT DOCUMENTS

| 2008/0121911 | A1 | 5/2008 | Andrews et al. |
| 2008/0290351 | A1 | 11/2008 | Ajiki et al. |
| 2010/0109508 | A1 | 5/2010 | Okuyama et al. |
| 2011/0163300 | A1 * | 7/2011 | Meng et al. .................... 257/40 |
| 2013/0264601 | A1 | 10/2013 | Matsumura et al. |
| 2014/0077237 | A1 | 3/2014 | Ajiki et al. |

FOREIGN PATENT DOCUMENTS

| CN | 101486854 A | * | 7/2009 |
| JP | 2003-101074 A | | 4/2003 |
| JP | 2003101074 A | | 4/2003 |
| JP | 2008-166740 A | | 7/2008 |
| JP | 2008166740 A | | 7/2008 |
| JP | 2008-294224 A | | 12/2008 |
| JP | 2008294224 A | | 12/2008 |
| TW | 201124362 A1 | | 7/2011 |
| WO | 2008/126500 A1 | | 10/2008 |
| WO | 2012/081411 A1 | | 6/2012 |
| WO | 2012/144030 A1 | | 10/2012 |

* cited by examiner

*Primary Examiner* — Richard Booth
(74) *Attorney, Agent, or Firm* — Novak Druce Connolly Bove + Quigg LLP

(57) ABSTRACT

A method for packaging an LED, includes steps: providing a supporting board and then dripping a gel mixed with fluorescent therein on the supporting board; scraping the gel over the supporting board with a scraper form a gelatinous fluorescent film on the supporting board, and solidifying the gelatinous fluorescent film pieces to form a solidified fluorescent film; cutting the solidified fluorescent film into individual pieces, and peeling the solid fluorescent films from the supporting board; attaching one piece of the fluorescent film on a light outputting surface of an LED die; mounting the LED die on a substrate, and electrically connecting the LED die to the circuit structure; and forming an encapsulation on the substrate to cover the LED die.

10 Claims, 8 Drawing Sheets

LIGHT EMITTING DIODE PACKAGE HAVING FLUORESCENT FILM DIRECTLY COATED ON LIGHT EMITTING DIODE DIE AND METHOD FOR MANUFACTURING THE SAME

BACKGROUND

1. Technical Field

The present disclosure generally relates to a light emitting diode (LED) package and method for manufacturing the same, and particularly to an LED package wherein a fluorescent film directly and conformably covers an LED die and a method for manufacturing the same.

2. Description of Related Art

In recent years, due to excellent light quality and high luminous efficiency, light emitting diodes (LEDs) have increasingly been used as substitutes for incandescent bulbs, compact fluorescent lamps and fluorescent tubes as light sources of illumination devices.

A common LED includes a substrate, electrodes arranged on the substrate, a reflective cup arranged on the substrate, an LED die arranged in the reflective cup and electrically connected to the electrodes, an encapsulation covering the LED die, and a fluorescent film coated on an outer surface of the encapsulation.

In packaging process of common LEDs, the fluorescent substance is firstly mixed in fluid encapsulating material, then the fluid encapsulating material is sprayed on the outer surface of the encapsulation, and finally the encapsulating material mixed with fluorescent substance is solidified. However, during the spraying process, the fluid encapsulating material cannot be completely uniformly sprayed on the encapsulation, due to an operational tolerance of the spray tool. Therefore the fluorescent film will be non-uniform in thickness. Further, the fluorescent substance suspending in the encapsulating material will deposit and undesirably cause a non-uniform distribution of the fluorescent substance in the encapsulating material. The uneven distribution of the fluorescent substance in the encapsulating material and the uneven fluorescent film cause light generated by the common LED to have an uneven color.

Therefore, what is needed is to provide an LED package and method of manufacturing the same which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packages, and a method for making the LED packages, in detail.

Figure 1:
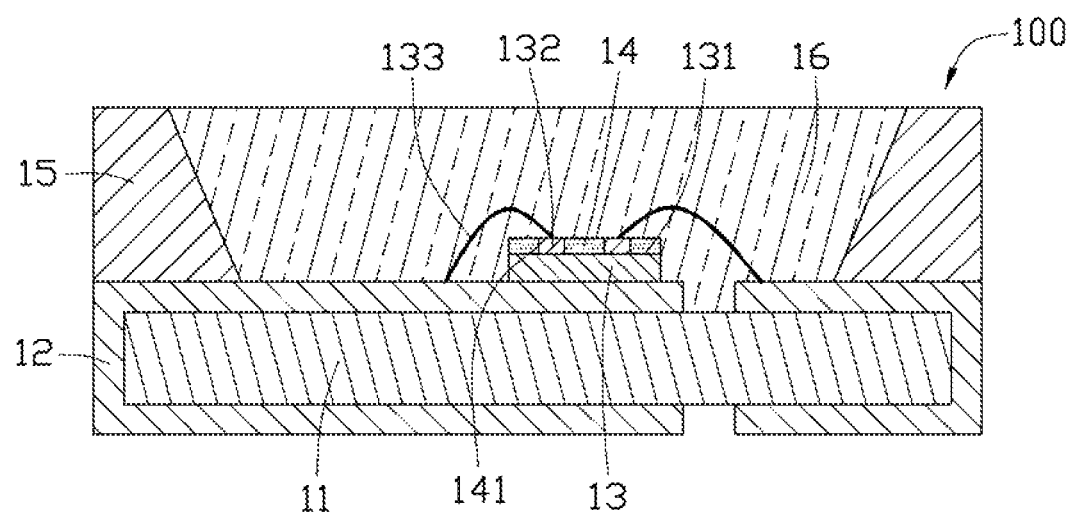
FIG. 1 is a schematic, cross-sectional view of an LED package in accordance with a first embodiment of the present disclosure.

Referring to FIG. 1, an LED package 100 of a first embodiment is provided. The LED package 100 includes a substrate 11, a circuit structure 12, an LED die 13, a fluorescent film 14, a reflective cup 15, and an encapsulation 16. The circuit structure 12 is formed on the substrate 11. The LED die 13 is mounted on the substrate 11 and electrically connected to the circuit structure 12. The fluorescent film 14 is attached on a top surface of the LED die 13. The reflective cup 15 is formed on the substrate 11 and surrounds the LED die 13. The encapsulation 16 covers the LED die 13 on the substrate 11 and the fluorescent film 14 on the LED die 13.

The LED die 13 is arranged on the circuit structure 12 and electrically connected to the circuit structure 12 by wire bonding. More specifically, the circuit structure 12 includes two circuit pads. The LED die 13 is secured to one of the circuit pads by heat conductive and electrically insulating glue and electrically connected to the two circuit pads by wire bonding. The LED die 13 includes a light outputting surface 131 on a top of the LED die 13 and facing away from the substrate 11. Two electrode pads 132 are formed on the light outputting surface 131 and protrude upwards from the light outputting surface 131. The electrode pads 132 on the top surface of the LED die 13 are connected to the circuit structure 12 by two metal wires 133.

The fluorescent film 14 is attached on the light outputting surface 131 of the LED die 13. The fluorescent film 14 includes two through holes 141. A size of each through hole 141 is similar to that of each electrode pad 132 of the LED die 13, and a position of each through hole 141 is corresponding to each electrode pad 132 of the LED die 13, whereby the electrode pads 132 can be fittingly received in through holes 141. The electrode pads 132 respectively penetrate through the two through-holes 141, and are exposed out of the fluorescent film 14.

Figure 2:
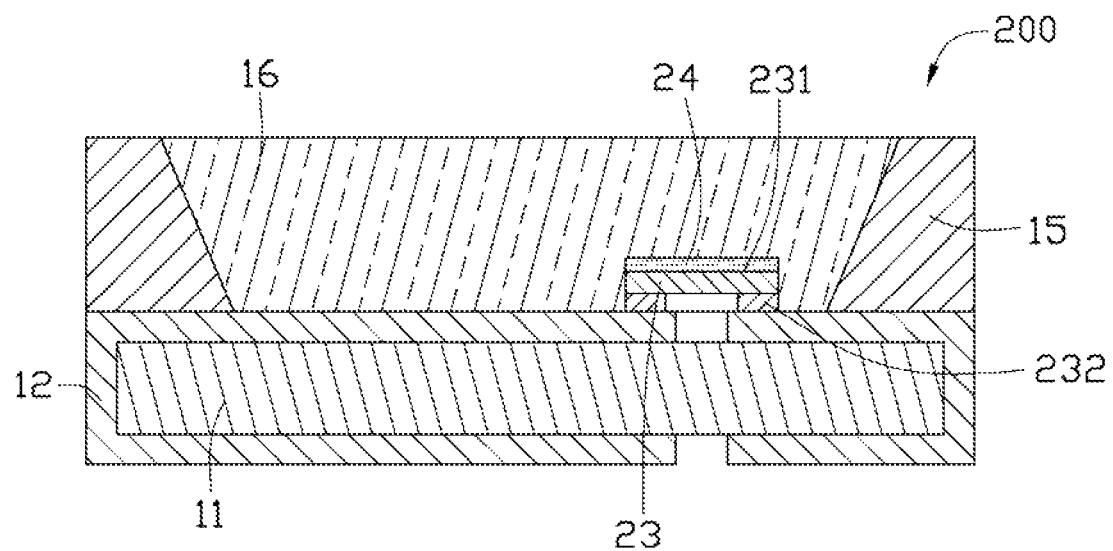
FIG. 2 is a schematic, cross-sectional view of an LED package in accordance with a second embodiment of the present disclosure.
Figure 3:
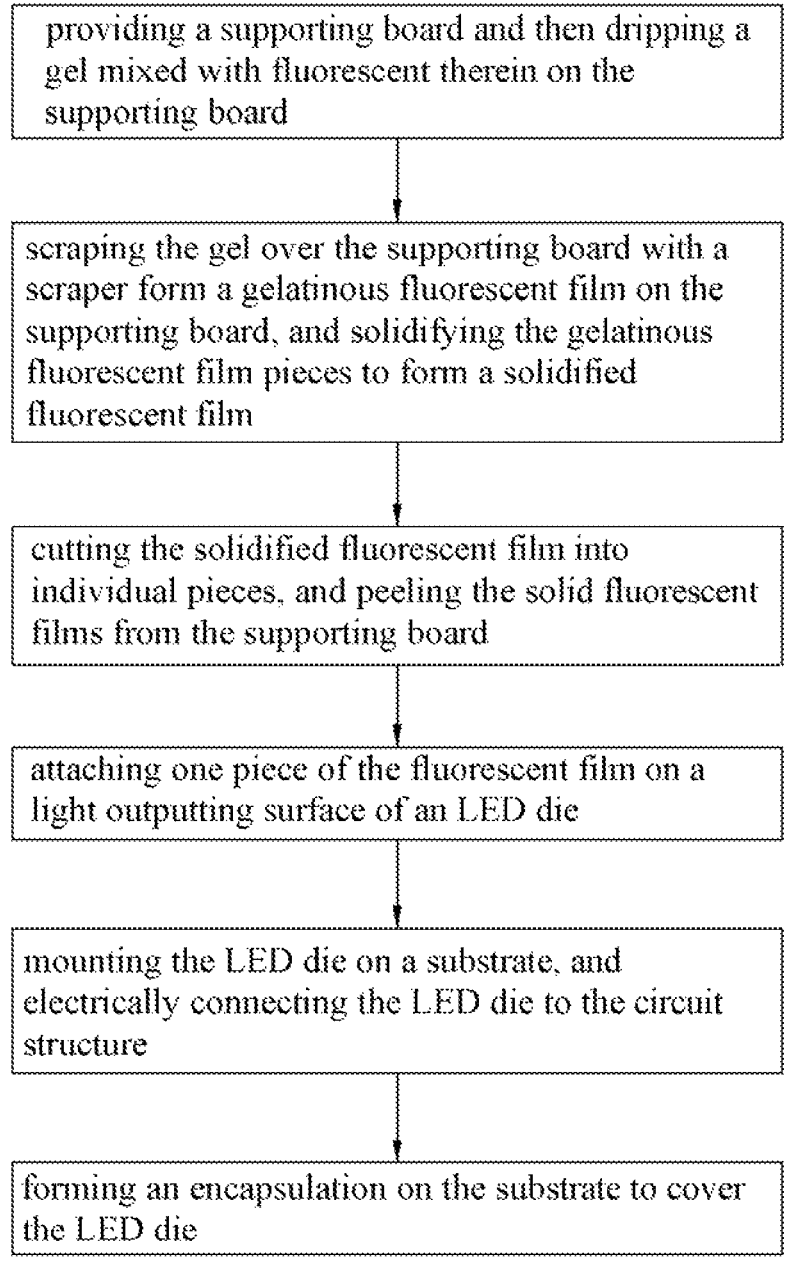
FIG. 3 is a flow chart of a method for forming the LED package in accordance with the first embodiment of the present disclosure.

Referring to FIG. 2, an LED package 200 according to a second embodiment is provided. The LED package 200 includes a substrate 11, a circuit structure 12 formed on the substrate 11, an LED die 23 mounted on the substrate 11 and electrically connected to the circuit structure 12, a fluorescent film 24 attached on a surface of the LED die 23, a reflective cup 15 formed on the substrate 11 and surrounding the LED die 23, and an encapsulation 16 covering the LED die 23 on the substrate 11. A bonding of the LED die 23 to the circuit structure 12 and a form of the fluorescent film 24 of the LED package 200 in the second embodiment are different from the LED package 100 of the first embodiment. In this embodiment, the LED die 23 are bonded on the circuit structure 12 by flip chip bonding. The LED die 23 includes a light outputting surface 231 and two electrode pads 232 formed on a surface of the LED die 23 away from the light outputting surface 231. The two electrode pads 232 are directly electrically connected to the circuit pads of the circuit structure 12, respectively. The fluorescent film 24 covers the light outputting surface 231 of the LED die 23 totally, without any through holes formed therein.

A method for manufacturing the LED package 100 in accordance with the first embodiment of the present disclosure includes steps of:

Step 1: providing a supporting board and then dripping a gel mixed with fluorescent therein on the supporting board;

Step 2: scraping the gel over the supporting board with a scraper form a gelatinous fluorescent film on the supporting board, and solidifying the gelatinous fluorescent film to form a solidified fluorescent film;

Step 3: cutting the solidified fluorescent film into individual pieces each with two through holes defined therein, and peeling the solidified fluorescent film pieces from the supporting board;

Step 4: attaching one piece of the fluorescent film on a light outputting surface of an LED die with electrode pads of the LED die penetrating through the two through holes;

Step 5: mounting the LED die on one of two circuit pads of a circuit structure on a substrate, and electrically connecting the electrode pads of the LED die to the circuit pads of the circuit structure by wire bonding;

Step 6: forming an encapsulation on the substrate to cover the LED die, the wires and the piece of the solidified fluorescent film.

Figure 4:
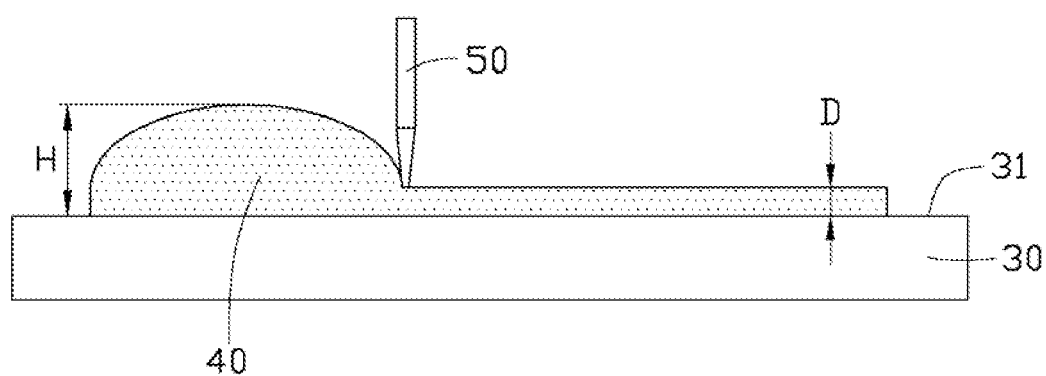
FIGS. 4-8 are schematic cross sections showing an LED package in accordance with the first embodiment of the present disclosure processed by various steps of the LED packaging method of FIG. 3.

In step 1, referring to FIG. 4, a supporting board 30 with a flat upper surface 31 is provided. A gel 40 evenly mixed with fluorescent powders therein is dripped on the upper surface 31 of the supporting board 30. A scraper 50 is positioned above the upper surface 31 with a distance therebetween. The scraper 50 can move over the supporting board 30 along a direction parallel to the upper surface 31 thereof. In other words, the scraper 50 is capable of scraping the gel 40 over the upper surface 31, along a direction parallel to the upper surface 31 of the supporting board 30. The distance D between a bottom edge of the scraper 50 and the upper surface 31 of the supporting board 30 is smaller than a height H of the gel 40 applied on the upper surface 31 of the supporting board 30.

Figure 5:
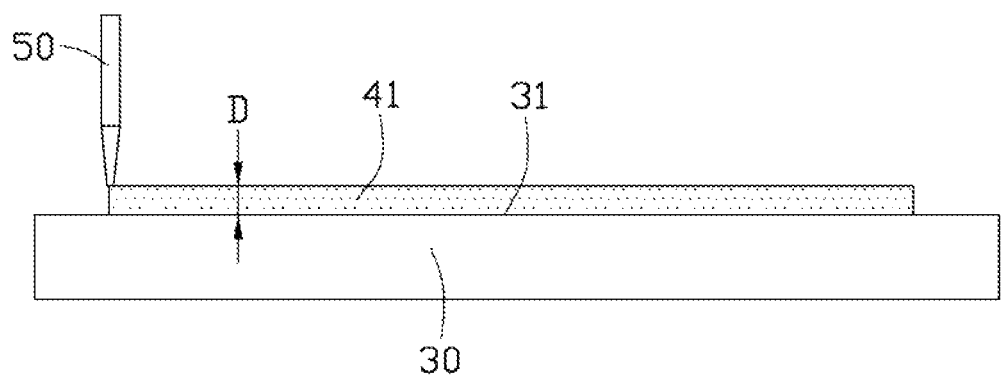

In step 2, referring to FIG. 5, the gel 40 is scraped over the supporting board 30 by the scraper 50 to form the gelatinous fluorescent film 41, and then the gelatinous fluorescent film 41 is then solidified to form the fluorescent film 14.

A thickness of the gelatinous fluorescent film 41 is equal to the distance D between the bottom edge of the scraper 50 and the upper surface 31 of the supporting board 30. The scrapping of the gel 40 to form the gelatinous fluorescent film 41 can be achieved by a relative movement between the scraper 50 and the supporting board 30. In this embodiment, the supporting board 30 is a movable relative to the scraper 50 while the scraper 50 is fixed in position. Alternatively, the scraper 50 is moveable over the supporting board 30 which is fixed in position. The scraper 50 is positioned above the supporting board 30 with the distance D therebetween. The thickness of the gelatinous fluorescent film 41 can be changed according to actual requirement, by adjusting the distance between the scraper 50 and the supporting board 30.

Accordingly, the gelatinous fluorescent film 41 is formed by the scraping process. Then the gelatinous fluorescent film 41 is solidified to form the solidified fluorescent film 14. The fluorescent substance suspending in the gel 40 will not deposit before the gel 40 is solidified, thereby avoiding a non-uniform distribution of the fluorescent substance in the fluorescent film 14. Accordingly, it can be avoided that the uneven distribution of fluorescent particles in the fluorescent film 14 to cause light generated by the common LED to have an uneven color. Furthermore, the concentration of the fluorescent substance in the fluorescent film 14 can be adjusted easily to meet different requirements. Finally, the thickness of the fluorescent film 14 can be easily controlled to be uniform through its entire length, whereby the uniformity of color of light generated by the LED package 100 can be further guaranteed.

Figure 6:
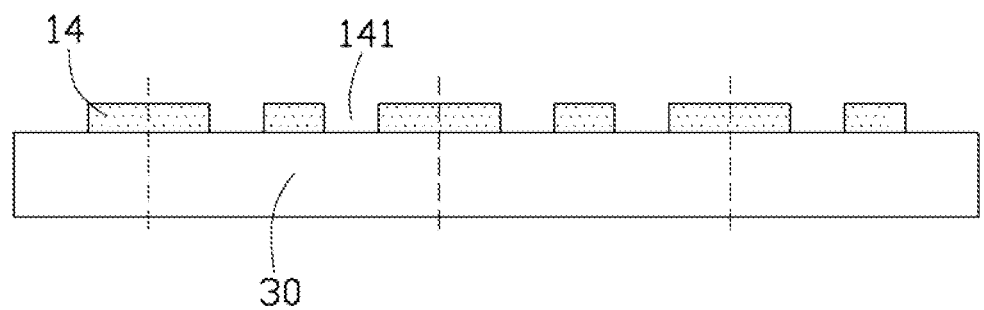

In step 3, referring to FIG. 6, the solidified fluorescent film 14 is cut into several individual pieces each with two through holes 141 defined therein, and peeled from the supporting board 30. Further, a size of each piece of the solidified fluorescent film 14 is substantially equal to that of the light outputting surface 131 of the LED die 13, whereby the piece of the fluorescent film 14 can cover the light outputting surface 131 of the LED die 13 totally. The position of each through hole 141 is corresponding to one of the electrode pads 132 of the LED die 13, whereby electrode pads 132 can fittingly extend in the through holes 141, respectively. The through holes 141 can be formed by cutting, punching or etching.

A polyester film can be employed during the peeling of the solidified fluorescent film 14 from the supporting board 30, by the following steps: attaching a polyester film on a surface of the solidified fluorescent film 14 away from the supporting board 30 to make the fluorescent film 14 adhered to the polyester film, and then rolling up the polyester film together with the solid fluorescent film 14. As such, the solidified fluorescent film 14 is rolled up together with the polyester film for easy storage. When use the polyester film and the fluorescent film 14 are unfolded and subject to a radiation to release the sticking nature of the polyester film, whereby the fluorescent film 14 can be easily removed from the polyester film to be applied to the light outputting surface 131 of the LED die 13.

Figure 7:
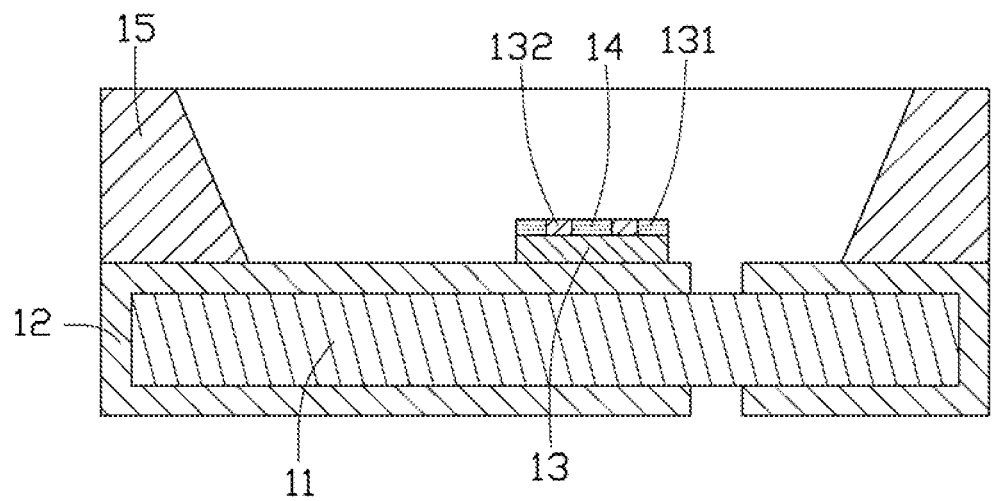

In step 4, referring to FIG. 7, the fluorescent film 14 is attached on a light outputting surface 131 of an LED die 13. Electrode pads 132 of the LED die 13 respectively penetrate through the two through holes 141 of the solidified fluorescent film 14 and are exposed out of the solidified fluorescent film 14.

Figure 8:
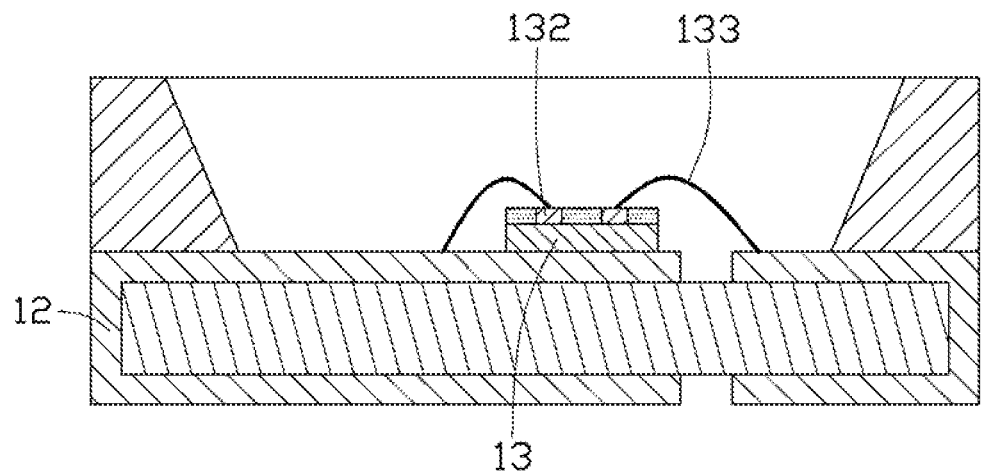

In step 5, referring to FIG. 8, the LED die 13 is mounted on a substrate 11 and electrically connected to a circuit structure 12 by wire bonding with metal wires 133 electrically connecting the electrode pads 132 and the circuit structure 12. In this embodiment, a reflective cup 15 is also formed on the substrate 11, surrounding the LED die 13.

In step 6, an encapsulation 16 is formed on the substrate 11 and covers the LED die 13, the wires 133 and the fluorescent film 14 to obtain an LED package. Furthermore, in this embodiment, the encapsulation 16 is filled in the reflective cup 15 to obtain an LED package 100 as shown in FIG. 1.

The step 4 can be exchanged with the step 5. That is, the fluorescent film 14 can be attached on the light outputting surface 131 of the LED die 13 after the LED die 13 is mounted on the substrate 11.

The method for manufacturing the LED package 200 in accordance with the second embodiment of the present disclosure is similar to the method for manufacturing the LED package 100 of the first embodiment. What is different is that, in this embodiment, the fluorescent film 14 can be directly cut into several individual pieces without any through hole defined therein. Then, each piece of the fluorescent films 14 is attached on a light outputting surface 231 of an LED die 23. The LED die 23 is mounted on the substrate 11 and connected to the circuit structure 12 by flip chip bonding.

In this process, the gelatinous fluorescent film 41 is made as a thin film by scraping the gel 40 doped with fluorescent substance firstly, and then solidified to form the solid fluorescent film 14. The fluorescent substance suspending in the gelatinous fluorescent film 41 can be uniformly distributed in the thin gelatinous fluorescent film 41 without causing a serious deposition. Accordingly, an even concentration of the fluorescent substance suspending in the gelatinous encapsulating glue 40 can be achieved and the thickness of the solidified fluorescent film 14 can be easily controlled, whereby a requirement of the solidified fluorescent film 14 to obtain a light with a uniform color can be assured.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for manufacturing an LED package, comprising steps:
   providing a supporting board and then dripping a gel mixed with fluorescent therein on the supporting board;
   scraping the gel over the supporting board with a scraper form a gelatinous fluorescent film on the supporting board, and solidifying the gelatinous fluorescent film pieces to form a solidified fluorescent film;
   cutting the solidified fluorescent film into individual pieces, and peeling the solid fluorescent films from the supporting board;
   defining two through-holes in the solidified fluorescent film;
   attaching one piece of the fluorescent film on a light outputting surface of an LED die;
   mounting the LED die on a substrate, and electrically connecting the LED die to the circuit structure; and
   forming an encapsulation on the substrate to cover the LED die.

2. The method for manufacturing the LED package of claim 1, wherein the supporting board comprises a flat upper surface, a distance between a bottom edge of the scraper and the upper surface of the supporting board being smaller than a proposed thickness of the gel.

3. The method for manufacturing the LED package of claim 2, wherein the substrate is a movable relative to the scraper while the scraper is fixed in position.

4. The method for manufacturing the LED package of claim 1, wherein the LED die comprises two electrode pads, and the two electrode pads are formed on a surface of the LED die away from the light outputting surface of an LED die.

5. The method for manufacturing the LED package of claim 4, wherein the LED die is mounted on the substrate and electrically connected to the circuit board by flip chip bonding.

6. The method for manufacturing the LED package of claim 1, wherein the LED die comprises two electrode pads, and the two electrode pads are positioned on the light outputting surface of an LED die.

7. The method for manufacturing the LED package of claim 1, wherein the solidified fluorescent film is attached on the light outputting surface of the LED die with the electrode pads penetrating through the two through-holes.

8. The method for manufacturing the LED package of claim 1, wherein the through-holes are made by cutting, etching or punching.

9. The method for manufacturing the LED package of claim 6, wherein the LED die is mounted on the substrate and connected to the circuit board by wire bonding.

10. A method for manufacturing a solid fluorescent film, comprising steps:
    providing a supporting board and then dripping a gel mixed with fluorescent therein on the supporting board;
    scraping the gel over the supporting board with a scraper form a gelatinous fluorescent film on the supporting board, and solidifying the gelatinous fluorescent film pieces to form a solidified fluorescent film;
    cutting the solidified fluorescent film into individual pieces, and peeling the solid fluorescent films from the supporting board;
    defining two through-holes in the solidified fluorescent film.

* * * * *